United States Patent
Ziglioli et al.

(10) Patent No.: US 9,011,776 B2
(45) Date of Patent: Apr. 21, 2015

(54) PACKAGED DEVICE EXPOSED TO ENVIRONMENTAL AIR AND LIQUIDS AND MANUFACTURING METHOD THEREOF

(71) Applicant: STMicroelectronics S.r.I., Agrate Brianza (IT)

(72) Inventors: Federico Giovanni Ziglioli, Pozzo d'adda (IT); Fulvio Vittorio Fontana, Monza (IT); Luca Maggi, Garlate (IT)

(73) Assignee: STMicoroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/013,730

(22) Filed: Aug. 29, 2013

(65) Prior Publication Data
US 2014/0061892 A1 Mar. 6, 2014

(30) Foreign Application Priority Data
Aug. 30, 2012 (IT) .............................. TO2012A0753

(51) Int. Cl.
*B81C 1/00* (2006.01)
*B81B 7/00* (2006.01)
*H04R 19/04* (2006.01)

(52) U.S. Cl.
CPC ............. *B81B 7/0077* (2013.01); *B81B 7/0058* (2013.01); *H04R 19/04* (2013.01); *B81B 2201/0264* (2013.01); *B81C 2203/0118* (2013.01); *B81C 1/00333* (2013.01)

(58) Field of Classification Search
CPC .............. B81B 7/0058; B81B 2201/0264; B81B 7/0077; B81C 2203/0118; B81C 1/00333; H04R 19/04
See application file for complete search history.

(56) References Cited

U.S. PATENT DOCUMENTS

| | | | |
|---|---|---|---|
| 3,963,881 A * | 6/1976 | Fraim et al. | 381/357 |
| 4,888,309 A | 12/1989 | Araya | |
| 6,296,748 B1 | 10/2001 | Ohtsuki et al. | |
| 6,700,200 B1 | 3/2004 | Annapragada | |
| 8,512,428 B2 * | 8/2013 | Ueki et al. | 55/385.4 |
| 2002/0181725 A1 | 12/2002 | Johannsen et al. | |
| 2007/0019033 A1 | 1/2007 | Sim et al. | |
| 2008/0056945 A1 * | 3/2008 | Hattori | 422/68.1 |
| 2008/0123171 A1 * | 5/2008 | Dausch et al. | 359/230 |

(Continued)

FOREIGN PATENT DOCUMENTS

| | | | | |
|---|---|---|---|---|
| WO | WO-2009/116957 | * | 9/2009 | H04R 19/04 |
| WO | 2009/116957 | | 8/2013 | |

OTHER PUBLICATIONS

Neil J. Shirtcliffe et al., "The use of high aspect ratio photoresist (SU-8) for super-hydrophobic pattern prototyping", Journal of Micromechanics and Microengineering, J. Micromech. Microeng. 14 (2004) 1384-1389; DOI:10.1088/0960-1317/14/10/013.

(Continued)

*Primary Examiner* — Roy Potter
*Assistant Examiner* — Paul Patton
(74) *Attorney, Agent, or Firm* — Seed IP Law Group PLLC (57) ABSTRACT

A packaged device, wherein at least one sensitive portion of a chip is enclosed in a chamber formed by a package. The package has an air-permeable area having a plurality of holes and a liquid-repellent structure so as to enable passage of air between an external environment and the chamber and block the passage of liquids.

22 Claims, 5 Drawing Sheets (56) References Cited

U.S. PATENT DOCUMENTS

2010/0297906 A1 11/2010 Steckl et al.
2010/0316531 A1 12/2010 Delattre et al.

OTHER PUBLICATIONS

Wenzel, R.N., "Resistance of Solid Surfaces to Wetting by Water", Industrial and Engineering Chemistry, vol. 28, No. 8, Aug. 1936, pp. 988-994.
Barthlott, W., "Purity of the sacred lotus, or escape from contamination in biological surfaces", Planta Springer-Verlag 1997, 202: 1-8.
Youngblood, J.P., "Ultrahydrophobic Polymer Surfaces Prepared by Simultaneous Ablation of Polypropylene and Sputtering of Poly(tetrafluoroethylene) Using Radio Frequency Plasma", 1999 American Chemical Society, Sep. 18, 1999, Macromolecules 1999, 32, 6800-6806.
Zhang, H., "Engineering nanoscale roughness on hydrophobic surface—preliminary assessment of fouling behaviour", Science and Technology of Advanced Materials 6 (2005) 236-239.
Zorba, V., "Making silicon hydrophobic: wettability control by two-lengthscale simultaneous patterning with femtosecond laser irradiation", Jun. 7, 2006, Institute of Physics Publishing, Nanotechnology, 17 (2006) 3234-3238.
Bhushan, B. et al., "Lotus Effect: Surfaces with Roughness-Induced Superhydrophobicity, Self-Cleaning and Low Adhesion", The Ohio State University, Nanoprobe Laboratory for Bio- & Nanotechnology and Biomimetics, Phil Trans. R. Soc. A 367, 1631 (2009), 46 pages.
Aculon, Inc. "Repellency Treatment", http://www.aculon.com/repellency-treatments.php, Copyright 2004-2012, 3 pages.
STMicroelectronics, "The Problem—Liquid Proof MEMS Pressure Sensor", pp. 1-9.
Lascaux the spirit of colours, "Lascaux Films, Fabrics and Papers", 4 pages.

* cited by examiner

PACKAGED DEVICE EXPOSED TO ENVIRONMENTAL AIR AND LIQUIDS AND MANUFACTURING METHOD THEREOF

BACKGROUND

1. Technical Field

The present disclosure relates to a packaged device exposed to environmental air and liquids and to the manufacturing method thereof. In particular, the present disclosure finds advantageous application in micro-electromechanical devices (MEMS), such as sensors made in semiconductor material chips provided with a sensitive area. For example, the disclosure may be used in pressure sensors, gas sensors, microphones and the like, which are designed to be exposed to environmental air for their operation but benefit from a barrier towards water or other liquids, for example water contained in droplets in the environmental air but also masses of liquids in which the device may be immersed by mistake.

2. Description of the Related Art

As is known, in certain applications, functionality of MEMS devices may be impaired or in any case limited in the presence of moisture. In fact, droplets of water may be adsorbed by the material of the devices, which consequently may swell, generating mechanical and/or electrical stresses, may modify their electrical characteristics (for example, sensitivity) with consequent erroneous readings, may be subjected to short-circuits that prevent their operation, or may even undergo damage, for example owing to corrosion of parts. In all these cases, the device becomes unreliable or even unusable.

For this purpose, also for reasons of mechanical protection, in certain applications MEMS devices are provided with protective caps that surround and protect from the external environmental each device and/or group of devices fixed to a common base.

In some known solutions, the protective cap is made of a completely impermeable material and is bonded or welded to the base to which the MEMS is fixed or on which it is printed. However, this solution is not always applicable. In fact, in certain applications, the sensor (for example, an atmospheric-pressure sensor) must be exposed to the external environment, so that it is not possible to use a cap impermeable to air.

When the MEMS device has to be in direct contact with the external environment, it is possible to provide holes in the cap; however, these form vias for diffusing liquids, such as water, condensed vapor, oil, flux used during welding of the MEMS on the electronic cards or other liquids which then may come into contact with the MEMS.

On the other hand, MEMS devices have to meet specifications that are increasingly stringent as regards the resistance to water and other liquids. For example, in cell phones of an advanced type, provided with barometric functions, it is desired to maintain functionality even when they are dropped into water to a depth of two meters for half an hour, in case of rain, or in case of splashes caused by waves. Similar specifications are called for by devices provided with Global Systems for Mobile Communication (GSM) with measurement of the axis Z. In washing machines, it has been proposed to use water-level sensors, which thus should be able to withstand hot vapors. Clocks having a depth measurement function and thus operating underwater, should be able to function properly.

BRIEF SUMMARY

According one or more embodiments to the present disclosure there is provided a packaged device that includes a package body having an air-permeable area and a liquid-repellant structure and the manufacturing method thereof. In one embodiment, the package body delimits a chamber and at least a portion of a chip is located in the chamber. The package body includes an air-permeable area having a plurality of holes and a liquid-repellent structure that together enable passage of air between an external environment and the chamber and block passage of liquids

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIG. 2b shows a variant of the enlarged detail of FIG. 2a;

DETAILED DESCRIPTION

Figure 1:
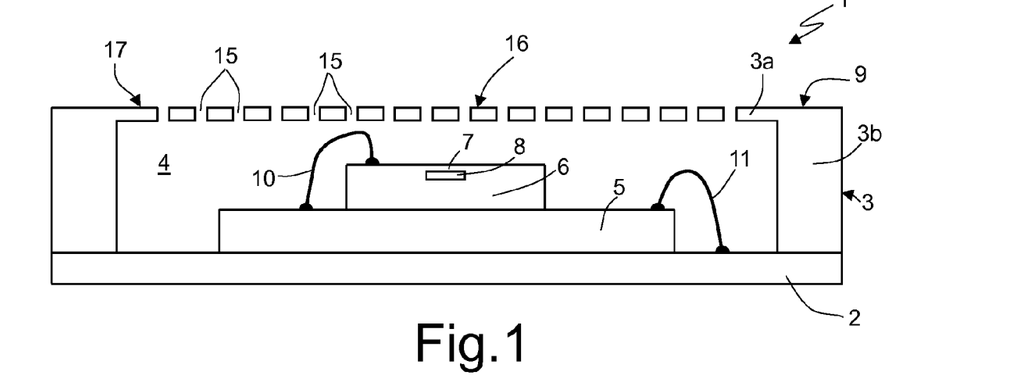
FIG. 1 is a cross-section of an embodiment of the present packaged device.

In FIG. 1, a packaged device 1 comprises a base 2 and a cap 3. The cap 3 is here half-shell shaped, generally parallelepipedal, including a top wall 3a and a side wall 3b and is fixed, typically glued, to the base 2, so as to form a package. The protective cap 3 and the base 2 form a package surrounding a chamber 4. In the embodiment of FIG. 1, an integrated circuit 5 is fixed on the base 2 within the chamber 4, for example glued, and a chip 6 is fixed on the integrated circuit 5, for example glued. Alternatively, both the integrated circuit 5 and the chip 6 could be fixed to the base 2, adjacent to each other. The top wall 3a has an outer surface 9.

For example, the base 2 may be formed by a single-layer or multi-layer organic substrate, of epoxy resin, such as a laminate of BT (bismaleimide triazine) or FR-4 or any other similar material for printed circuits, or by a ceramic substrate and has a parallelepipedal plate shape.

The cap 3 may be, for example, of silicon, metal, ceramic, Teflon or other plastic material, in particular polymeric, for instance a material similar to the one used for manufacturing the core of FR-4 or BT substrates.

The chip 6 forms a MEMS (microelectromechanical system), for example, a pressure sensor. In this case, the chip 6 may have a membrane 7 delimited by a buried cavity 8. The integrated circuit 5 may form a signal-processing circuit of the chip 4, for example a reading circuit formed as an ASIC (Application-Specific Integrated Circuit) for amplifying and treating the signal supplied by the chip 6. Conductive wires 10 connect the chip 6 to the integrated circuit 5 and conductive wires 11 connect the integrated circuit 5 to conductive areas (typically contact pads and connection lines not shown, on the surface and/or integrated in the substrate 2), for exchanging electrical signals and power supplies, in a per se known manner.

The cap 3 comprises a permeable area 17 arranged preferably over the chip 6 and carrying a liquid-repellent, hydrophobic, oleophobic, or lipophobic structure. A plurality of holes 15 is formed in the permeable area 17.

Figure 2A:
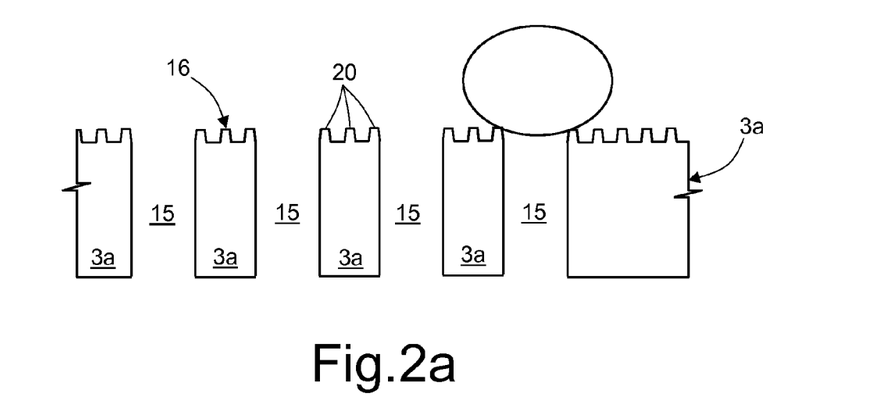
FIG. 2a shows an enlarged detail of FIG. 1.
Figure 2B:
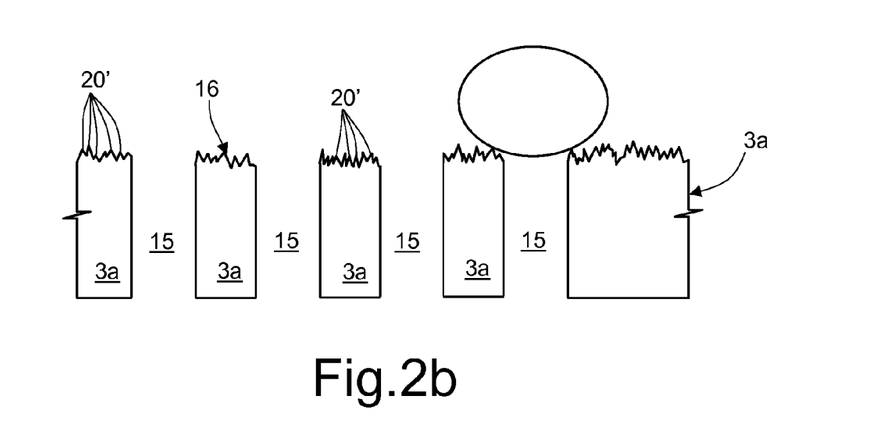

In the embodiment of FIG. 1, the liquid-repellent structure is formed by a rough nanostructure 16 defined by the outer surface 9 of the top wall 3a of the cap 3, as shown in the enlarged detail of FIGS. 2a and 2b.

In FIG. 2a, the outer surface 9 has microreliefs 20 having geometrical characteristics such as to impart on the outer surface 9 a desired roughness. Here, the microreliefs 20 are formed by pillars with circular, square, or polyhedral, base that are frustoconical, parallelepipedal, frustopyramidal, or the like. For example, the microreliefs or pillars 20 may have a base side or diameter comprised between 0.5 and 20 μm, a height comprised between 1 and 50 μm and be arranged at a mutual distance (pitch) comprised between 2 and 150 μm. The microreliefs 20 may be distributed differently, for example have a greater width so that a single microrelief 20 is arranged between a pair of adjacent holes 15 (similarly to what shown in FIGS. 4 and 9, as described in greater detail hereinafter). The holes 15 may have any shape, for example circular, quadrangular, polygonal, whether regular or irregular and be made before or after forming the rough nanostructure 16, for example, by masked chemical etching, in a known manner. Alternatively, the holes 15 may be formed by laser drilling.

For example, with a top surface 3a of the cap 3 having a thickness comprised between 20 and 100 μm in the area of the holes 15, these may have a width comprised between 0.1 and 100 μm and be arranged at a mutual distance comprised between 0.3 and 300 μm, with a width-to-pitch ratio of, for example, at least 1:3. However, in case of single microreliefs 20 between two adjacent holes 15 (FIGS. 4 and 9), the width-to-distance ratio may be also equal to or greater than 1.

In FIG. 2b, the rough nanostructure 16 is irregular and the microreliefs 20' typically differ in shape, arrangement, base area, height and other geometrical characteristics. The holes 15 may have the dimensions indicated above.

In either case, for example, the rough nanostructure 16 may have a value Ra (defined as arithmetic average value of the deviations in absolute value of the actual profile of the surface with respect to the mean line) comprised between 0.5 and 3 μm, Rmax (defined as maximum deviation, i.e., distance between the highest peak and the lowest point of the surface 9) comprised between 2 and 20 μm.

The rough nanostructure 16 of FIG. 2a may be formed via nanolithography on silicon.

Alternatively, the irregular rough nanostructure 16 of FIG. 2b may be formed by chemical etching. If the cap 3 is of metal, the chemical etching may be performed with hydrofluoric acid.

Alternatively, the rough nanostructure 16 of FIG. 2b may also be formed by laser irradiation of the cap 3 if made of silicon, or hot embossing or laser irradiation of the cap 3 if it is made of plastic material.

By varying the level of laser irradiation, it is possible to modify the roughness and thus the wettability of the top surface 3a of the silicon cap 3 so as to increase the value of the contact angle beyond 90°.

After forming the rough nanostructure 16, the protective cap 3 is fixed to the base 2 where the integrated circuit 5 and the chip 6 have been already fixed, so that the chamber 4 surrounds them.

The hydrophobicity of rough silicon surfaces has been reported in numerous studies; see, for example, "Making silicon hydrophobic: wettability control by two-length scale simultaneous patterning with femtosecond laser irradiation", V. Zorba et al., 2 Nanotechnology 17 (2006) 3234-3238, IP address for downloading: 77.242.201.53.

In this way, the holes 15 enable environmental air to enter the chamber 4 but the rough nanostructure 16 prevents droplets of water or other liquids from penetrating into the chamber 4 through the holes 15, as shown in the detail of FIGS. 2a and 2b. Consequently, the chip 6 is able to work properly, for example measuring the atmospheric pressure, without being damaged by external humidity, water, or other liquids in which the packaged device 1 were to be dropped.

Figure 3:
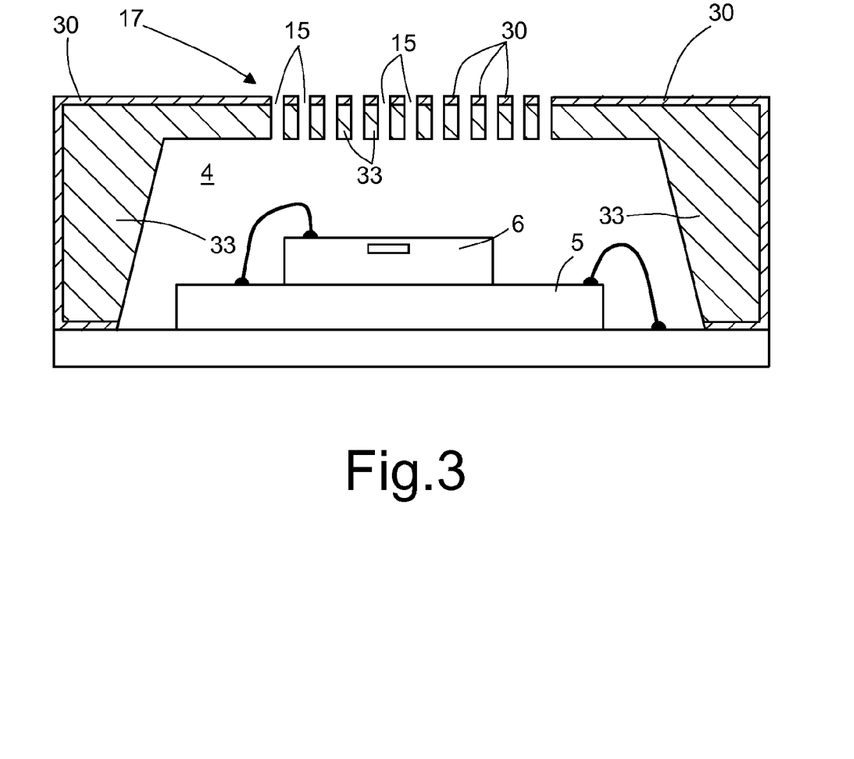
FIG. 3 is a cross-section of another embodiment of the present packaged device.

In FIG. 3, the liquid-repellent structure is formed by a hydrophobic/lipophobic liquid-repellent layer 30, which extends over the cap 33, at least on top of the area of the holes 15. In the example shown, the liquid-repellent layer 30 coats the outer surface of the entire cap 33.

The liquid-repellent layer 30 may be a layer of a material chosen from among Teflon, silicon carbide, resist such as SU-8 (see, for example: "The use of high aspect ratio photoresist (SU-8) for super-hydrophobic pattern prototyping", Neil J. Shirtcliffe et al., JOURNAL OF MICROMECHANICS AND MICROENGINEERING, J. Micromech. Microeng. 14 (2004) 1384-1389, IP address for downloading: 77.242.201.53), polymers (see, for example: "Ultrahydrophobic Polymer Surfaces Prepared by Simultaneous Ablation of Polypropylene and Sputtering of Poly(tetrafluoroethylene) Using Radio Frequency Plasma", Jeffrey P. Youngblood et al., Macromolecules 1999, 32, 6800-6806, 1999 American Chemical Society), organometals, or transition-metal complexes, such as the materials produced by Aculon.

The liquid-repellent layer 30 may be formed by dipping the protective cap 33 in an appropriate solution or by mechanical deposition via spinning or by thermochemical deposition.

Alternatively, the material of the liquid-repellent layer 30 may be the material described in the patent application "Process for manufacturing a microdevice having regions with different wettability and corresponding microdevice" filed on the same date by the present applicant, the material being obtained by arranging the cap 3 in a plasma of $C_4F_8$ precursor gas in an apparatus for reactive-ion-etching processes so as to obtain a $C_4F_8$ polymer having a static contact angle greater than 100°, with spectral absorption peak at a wave number comprised between 1200 $cm^{-1}$ and 1300 $cm^{-1}$, in particular 1250 $cm^{-1}$.

After coating the cap 33 with the liquid-repellent layer 30, the holes 15 are formed using the techniques indicated above (chemical etching and/or laser drilling).

Figure 4:
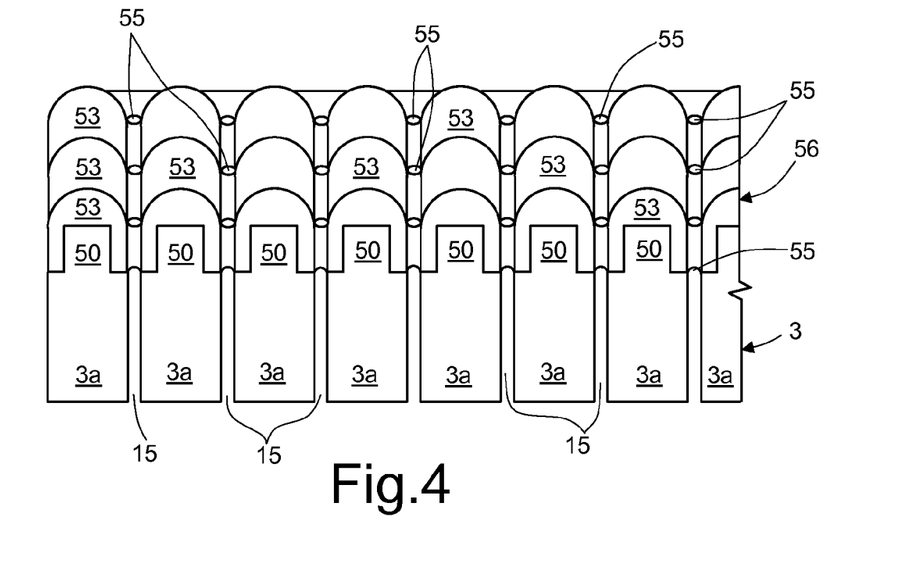
FIG. 4 shows a perspective and enlarged view of a detail of a different embodiment of the package.
Figure 5:
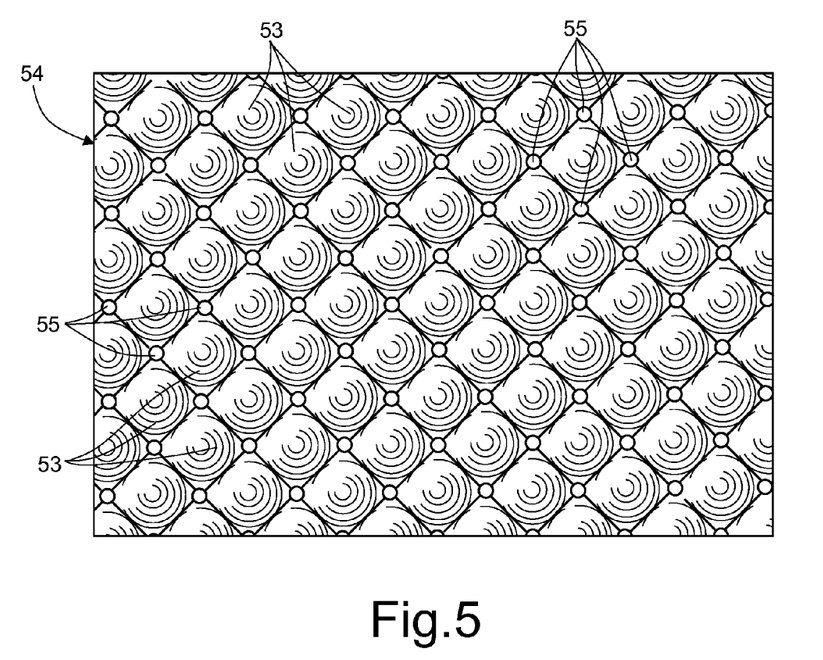
FIG. 5 is a top plan view of the detail of FIG. 4.

FIGS. 4 and 5 show a detail of an embodiment where the rough nanostructure 16 is formed by a plurality of pillars 50, of silicon, formed on the outer surface 9, projecting from the top wall 3a and monolithical with the cap 3. The pillars 50 here have a reduced width as compared to the distance between two adjacent holes 15 and may have a more or less squared shape.

In addition, in the example shown, the pillars 50 are covered by caps 53 belonging to a hydrophobic/lipophobic layer 54, for example, a metal or non-metal layer such as Teflon. The hydrophobic/lipophobic layer 54 has openings 55 (see, in particular, FIG. 5) above the holes 15 so as to enable passage of air through the openings 55 and the holes 15, as far as the underlying chamber 4 (not visible in FIGS. 4 and 5).

Here, the holes 15 may be arranged at a maximum distance from each other comprised between 300 nm and 20 μm, for example 400 nm, have a maximum width comprised between 50 nm and 10 μm, for example 60 nm, and the pillars 50 may have a width comprised between 150 nm and 15 μm, for example 200 nm. The hydrophobic/lipophobic layer 54 may have a thickness comprised between 100 nm and 1 µm, for example 300 nm.

Figure 6:
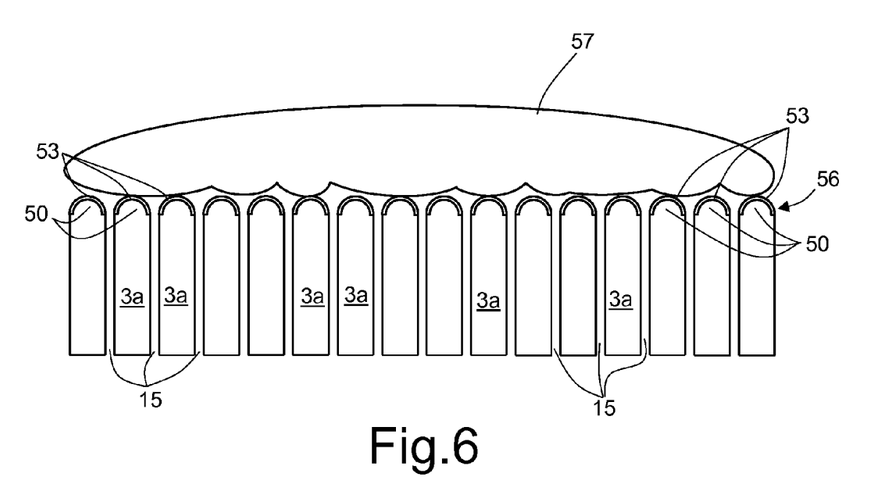
FIG. 6 shows the repellent behavior of the package of FIG. 4.

In FIG. 6, the rough nanostructure 16 on the outer surface 9 of the cap 3 is formed by spheroidal structures that resemble the pillars 50. As may be noted, the rough nanostructure 16 (pillars 50) and the hydrophobic/lipophobic layer 54 form also here a liquid-repellent structure 56 that prevents entry of liquids into the holes 15. In practice, due to surface tension of the liquids, the liquid-repellent structure 56 does not allow a liquid drop 57 to wet its entire surface, but air pockets are formed underneath the drops and prevent the latter from entering the holes 15.

Figure 7:
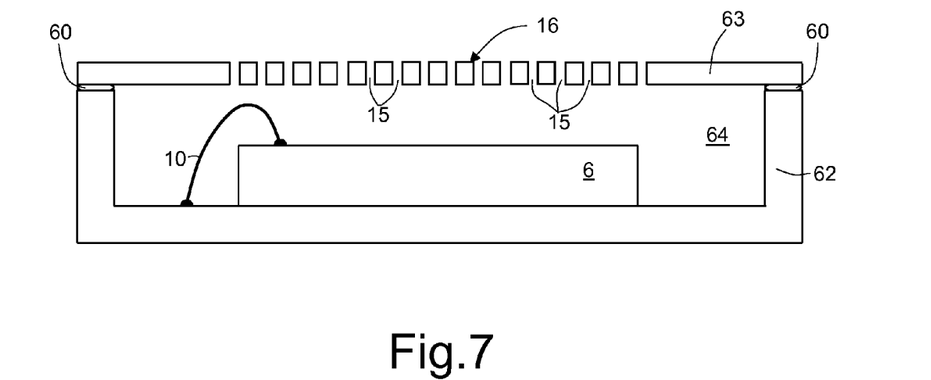
FIG. 7 is a cross-section of a different embodiment of the present packaged device.

FIG. 7 shows an embodiment where the cap 63 is formed by a plane wall and is bonded via adhesive portions 60 to a base 62 half-shell shaped, generally parallelepipedal, which defines, together with the protective cap 63, the chamber 64. Here, the chip 6 is directly bonded to the base 62. As in FIG. 1, the cap 63 has holes 15 and a rough nanostructure 16 such as to enable entry of air but not of liquids, thanks to its hydrophobic or lipophobic structure.

Figure 8:
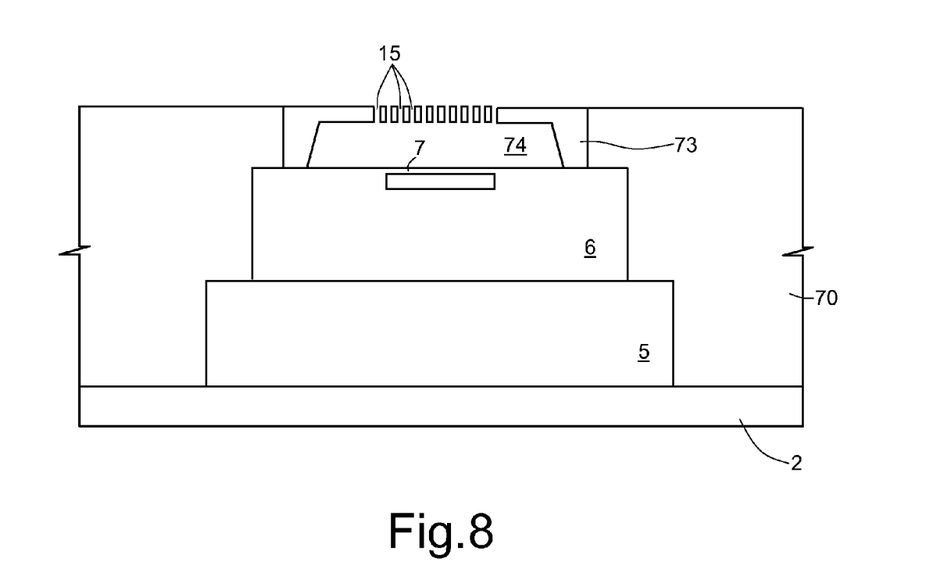
FIGS. 8-10 show other embodiments of the present device.

FIG. 8 shows an embodiment where the cap 73 is fixed to the top of the chip 6 and thus the chamber 74 does not surround the latter but only the membrane 77 (sensitive area of the chip 6; cap 73 made at a chip-scale level). Here, a molded region 70 laterally surrounds the cap 73, the chip 6 and the integrated circuit 5, laterally aligned to the base 2 and at the top to the cap 73. The molded region 70 is, for example, of plastic material and may comprise resin.

The cap 73 also here has a liquid-repellent structure, made according to what shown in FIGS. 1-6.

Figure 9:
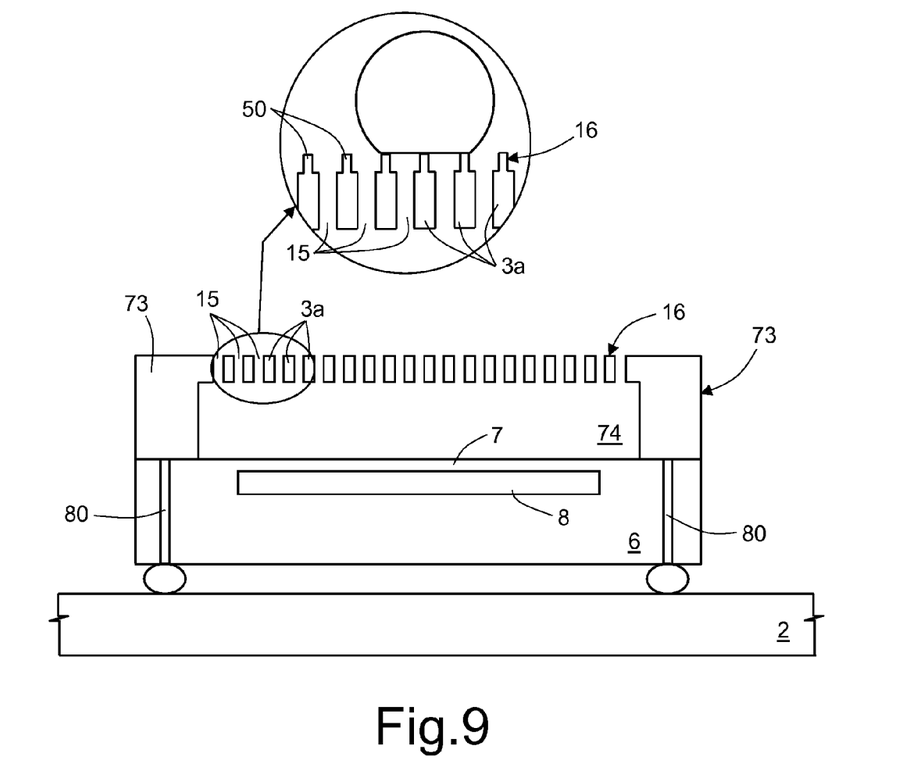

In FIG. 9, the cap 73 is directly fixed to the chip 6, similarly to FIG. 8, but the chip 6 is directly fixed to the base 2 and has suitable through connections 80. Here, the molded region 70 is missing and the liquid-repellent structure 56 is formed by non-coated pillars 50, as highlighted in the enlarged detail. Alternatively, also in this case the pillars 50 may be coated with a hydrophobic/lipophobic layer, such as the layer 54 of FIGS. 4-5 or may be replaced by the rough nanostructure 16 of FIG. 6, with spheroidal structures.

Figure 10:
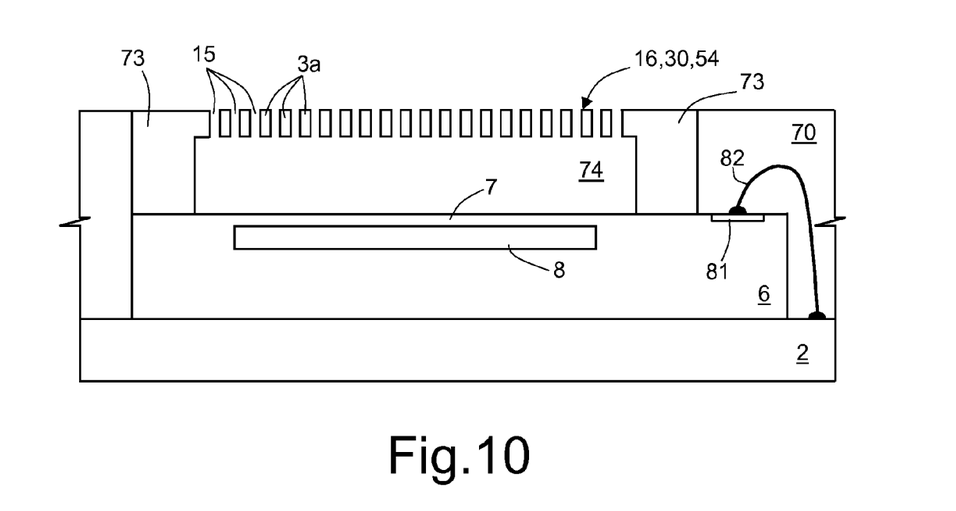

In FIG. 10, the cap 73 is once again directly fixed to the chip 6, but the electrical connection between the chip 6 and the base 2 occurs via contact pads 81 and wire 82, in a known way. Here, the molded region 70 is present.

Obviously, other intermediate combinations are possible and the liquid-repellent structure 56 may be made in any way described above with reference to FIGS. 1-9.

Finally, it is clear that modifications and variations may be made to the packaged device described and illustrated herein, without thereby departing from the scope of the present disclosure.

For example, in the embodiment of FIGS. 4-6, the pillars may have head portions of different shape, for example hemispherical or irregular, so as to form a non-plane top surface.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged device, comprising:
   a chip; and
   a package body delimiting a chamber, at least a portion of the chip being located in the chamber, the package body including a plurality of holes that enable passage of air between an external environment and the chamber, the package body including an outer surface having a surface roughness that is configured to block passage of liquids through the plurality of holes.

2. The packaged device according to claim 1, wherein the plurality of holes have a maximum width between 0.1 and 100 µm and have a pitch between 0.3 and 300 µm.

3. The packaged device according to claim 1, wherein the package body includes a protective cap delimiting an upper portion the chamber, the protective cap including the plurality of holes.

4. The packaged device according to claim 3, wherein the surface roughness is created by pillars formed in the surface.

5. The packaged device according to claim 4, wherein the surface roughness has a roughness value between 1 and 3 µm and a maximum deviation between 2 and 20 µm.

6. The packaged device according to claim 3, wherein the outer surface is a surface of the protective cap and the surface roughness is created by a plurality of microreliefs, the microreliefs having a regular structure and being uniformly arranged on the outer surface of the protective cap.

7. The packaged device according to claim 6, wherein the surface of the protective cap includes a hydrophobic/lipophobic layer that covers the protective cap and is provided with openings overlying the plurality of holes, respectively.

8. The packaged device according to claim 7, wherein the hydrophobic/lipophobic layer includes at least one of Teflon, silicon carbide, resist, metal, polymer, $C_4F_8$ polymer having a static contact angle greater than 100°, a spectral absorption peak at a wave number between 1200 $cm^{-1}$ and 1300 $cm^{-1}$, organometal, and transition-metal complex.

9. The packaged device according to claim 3, wherein the protective cap includes at least one of silicon, metal, plastic, and ceramic.

10. The packaged device according to claim 1, wherein the chip integrates a MEMS, and an upper surface of the MEMS is located in the chamber.

11. A method for manufacturing a packaged device, the method comprising:
    forming a package body delimiting a chamber;
    enclosing at least a portion of a chip in the package body with the chamber being located over a sensitive portion of the chip;
    forming a plurality of holes through a surface of the package body, the plurality of holes being configured to allow air pass between an external environment and the chamber; and
    forming a rough structure having microreliefs on the surface of the package body, the rough structure having microreliefs being configured to prevent fluid from the external environment from entering the chamber.

12. The method according to claim 11, further comprising coating the surface of the package body.

13. The method according to claim 12, wherein coating the surface of the package body comprises forming a hydrophobic/lipophobic layer on the surface of the package body.

14. The method according to claim 11, wherein forming the package body includes forming a protective cap over the sensitive portion of the cap, wherein the plurality of holes are located in the protective cap.

15. The method according to claim 14, wherein forming the hydrophobic/lipophobic layer comprises dipping the protective cap in a solution or depositing via spinning material having hydrophobic/lipophobic characteristics.

16. The method according to claim 12, wherein forming the plurality of holes is carried out before or after coating the surface of the package body.

17. A packaged device, comprising:
- a chip that includes a membrane;
- a package body having an inner chamber, a portion of the chip being located in the chamber of the package body, the package body including a structure having an inner surface located proximate the inner chamber and an outer surface, the structure including a plurality of holes that extend from the outer surface to the inner surface, the plurality of holes being configured to allow air to flow between an environment outside of the package body and the inner chamber, the outer surface of the structure having a roughened surface that is configured to prevent water droplets from being provided to the inner chamber.

18. The packaged device according to claim 17 wherein the structure is a cap of the package body and is located over the membrane of the chip.

19. The packaged device according claim 17 wherein the structure has roughness value between 0.5 and 3 µm.

20. The package device according claim 17 wherein the roughened surface includes a plurality of pillars, each having a similar shape as each other.

21. The packaged device according to claim 17 wherein a portion of the chip forms the package body.

22. The packaged device according to claim 17 wherein the chip includes at least one of a pressure sensor, a microphone and a gas sensor.

* * * * *